(12) United States Patent
Lee et al.

(10) Patent No.: US 6,586,306 B2
(45) Date of Patent: Jul. 1, 2003

(54) METHOD FOR FABRICATING SEMICONDUCTOR DEVICE

(75) Inventors: Hi Deok Lee, Chungcheungbuk-do (KR); Seong Hyung Park, Chungcheungbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/125,271

(22) Filed: Apr. 18, 2002

(65) Prior Publication Data

US 2002/0153562 A1 Oct. 24, 2002

(30) Foreign Application Priority Data

Apr. 24, 2001 (KR) .................... 2001-0021936

(51) Int. Cl.[7] ..................... H01L 21/336; H01L 21/335; H01L 21/8232
(52) U.S. Cl. ................. 438/305; 438/303; 438/142
(58) Field of Search ................. 438/142, 303, 438/305, 423, 520, 528

(56) References Cited

U.S. PATENT DOCUMENTS

| | | | |
|---|---|---|---|
| 6,200,834 B1 * | 3/2001 | Bronner et al. | 438/303 |
| 6,271,572 B1 * | 8/2001 | Fujita | 257/392 |
| 6,410,991 B1 * | 6/2002 | Kawai et al. | 438/423 |
| 6,495,896 B1 * | 12/2002 | Yaegashi et al. | 257/500 |

* cited by examiner

Primary Examiner—John F. Niebling
Assistant Examiner—Walter L. Lindsay, Jr.
(74) Attorney, Agent, or Firm—Marshall, Gerstein & Borun

(57) ABSTRACT

A method for fabricating a semiconductor device is disclosed. In a high speed device structure consisting of a salicide, in order to fabricate a device having at least two gate oxide structures in the identical chip, an LDD region of a core device region is formed, and an ion implant process for forming the LDD region of an input/output device region having a thick gate oxide and a process for forming a source/drain region at the rim of a field oxide of the core device region having a thin gate oxide are performed at the same time, thereby increasing a depth of a junction region. Thus, the junction leakage current is decreased in the junction region of the peripheral circuit region, and the process is simplified. As a result, a process yield and reliability of the device are improved.

15 Claims, 6 Drawing Sheets

METHOD FOR FABRICATING SEMICONDUCTOR DEVICE

BACKGROUND

1. Technical Field

A method for fabricating a semiconductor device is disclosed. In particular, an improved method for fabricating a semiconductor device is disclosed which provides a difference in junction depth by performing at least one implant process for forming an LDD region in a MOSFET having a thin gate oxide in a high speed device having a salicide (self-aligned silicide).

2. Description of the Related Art

In general, the most important function of a transistor of a semiconductor circuit is a current driving function. A channel width of a metal-oxide-semiconductor field effect transistor (MOSFET) is adjusted in consideration of the current driving function. In the most widely-used MOSFET, an impurity-doped polysilicon layer is used as a gate electrode, and a diffusion region formed by doping an impurity on a semiconductor substrate is used as a source/drain region.

A buried channel is formed in a positive metal-oxide-semiconductor field effect transistor (PMOSFET) which uses an N+ doped polysilicon gate electrode in a complementary metal-oxide-semiconductor field effect transistor (CMOSFET). Here, because a negative metal-oxide-semiconductor field effect transistor (NMOSFET) with a channel on its surface and the PMOSFET have different threshold voltages, there are various restrictions in design and fabrication of the device.

That is, in the CMOSFET using a dual gate electrode, the dual gate electrodes are formed by ion-implanting N-type and P-type impurities twice. Therefore, a photolithography process should be performed twice, and this complicates the fabrication process. Accordingly, the device is easily contaminated due to a wet process, and thus the process yield and reliability of the devices are reduced.

FIGS. 1A through 1C are cross-sectional views illustrating sequential steps of a conventional method for fabricating such a semiconductor device which is an example of a MOSFeT having a thin gate oxide film.

First, referring to FIG. 1A, a field oxide 11 defining an active region is formed on a semiconductor substrate 10. A thin gate oxide 12 and a polysilicon layer (not shown) are formed on the semiconductor substrate 10. Thereafter, the polysilicon layer is etched using a gate electrode mask as an etching mask, to form a gate electrode 13. An LDD (lightly doped drain) region 14 is formed by ion-implanting a low concentration impurity to the semiconductor substrate 10 at both sides of or around the gate electrode 13. An insulating film spacer 15 is formed at side walls of the gate electrode 13.

As shown in FIG. 1B, a first source/drain region 16 is formed by ion-implanting a high concentration impurity to the semiconductor substrate 10 at both sides of or around the insulating film spacer 15. Thereafter, a second source/drain region 17 is formed by implanting a dopant having a high diffusion ratio at a low dose.

As shown in FIG. 1C, a silicide layer 18 is then formed on the surfaces of the gate electrode 13, and the semiconductor substrate.

However, the conventional method for fabricating the semiconductor device has a limit due to a shallow junction region resulting from miniaturization of the device. Specifically, the depth of the junction region is increased by the ion implant process for forming the silicide layer 18, which influences the LDD region 14 due to the close proximity of the silicide layer 18 to the LDD region 14 as shown in FIG. 1C. Further, when the silicide layer 18 is formed deeply along the rim of the field oxide, a leakage current is considerably increased in the junction region adjacent to the field oxide 11. Still further, as the height of the field oxide is decreased during subsequent processes, the leakage current increases.

SUMMARY OF THE INVENTION

Accordingly, a method for fabricating a semiconductor device is disclosed which can prevent an increase of the junction leakage current and which can improve the process yield and reliability, by forming a deep junction near the field oxide which does not influence the channel region of a MOSFET where a gate oxide is thin (hereinafter referred to as "a core device"), by partially exposing a source/drain region adjacent to the field oxide to a photolithography process for forming an LDD region of an input/output device between the core device and a MOSFET where the gate oxide film (hereinafter referred to as "a input/output device) is thick in a CMOS fabrication process, and by ion-implanting an impurity thereto at the same time an ion implant process is carried out for forming the LDD region of the input/output device region.

A disclosed method for fabricating a semiconductor device comprises: forming a field oxide defining an active region on a semiconductor substrate having a central core device region and a peripheral input/output device region; forming a gate oxide on the core device region; forming a gate electrode on the gate oxide; forming a first LDD region by ion-implanting a low concentration of impurity ions to the input/output device region of the active region; forming a photoresist film pattern over the gate electrode and on the sides of the gate electrode, the photoresist film pattern reaching from an end of the gate oxide to a part of input/output device region spaced a determined distance from the gate electrode or gate oxide; forming a second LDD region deeper than the first LDD region by implanting a low concentration of impurity ions by using the photoresist film pattern as an ion implant mask; removing the photoresist film pattern; forming an insulating film spacer on side walls of the gate electrode; forming a deep source/drain region and a shallow source/drain region by implanting a high concentration impurity ions to the input/output device region of the active region of the semiconductor substrate at least once, by using the insulating film spacer as an ion implant mask; and forming a silicide film on the gate electrode and the source/drain regions.

A novel semiconductor device made in accordance with the methods disclosed herein is also disclosed.

BRIEF DESCRIPTION OF THE DRAWINGS

The disclosed methods and devices will become better understood with reference to the accompanying drawings which are given only by way of illustration and thus are not limitative of the disclosure, wherein.

DETAILED DESCRIPTION OF THE PRESENTLY PREFERRED EMBODIMENTS

A method for fabricating a semiconductor device in accordance with preferred embodiments will now be described in detail with reference to the accompanying drawings.

FIGS. 2A through 2D are cross-sectional views illustrating sequential steps of a method for fabricating a semiconductor device in accordance with a first embodiment. A core device region is shown in an NMOS region or PMOS region of a CMOS.

Figure 1A:
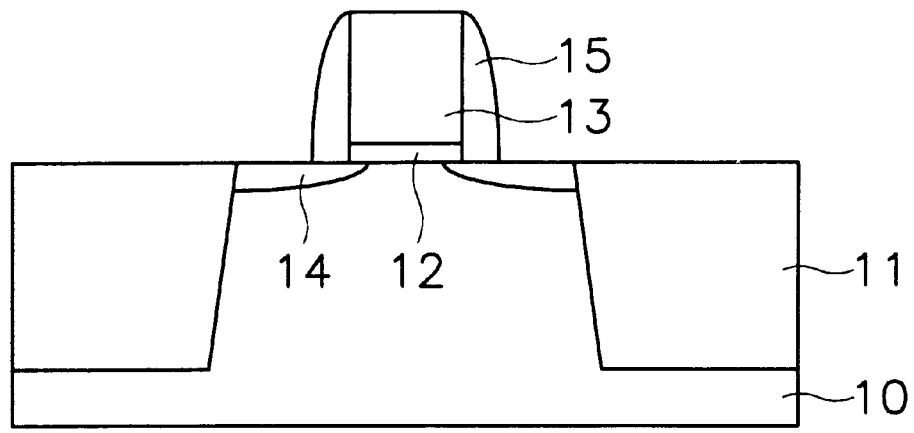
FIGS. 1A through 1C are cross-sectional views illustrating sequential steps of a conventional method for fabricating a semiconductor device.
Figure 1B:
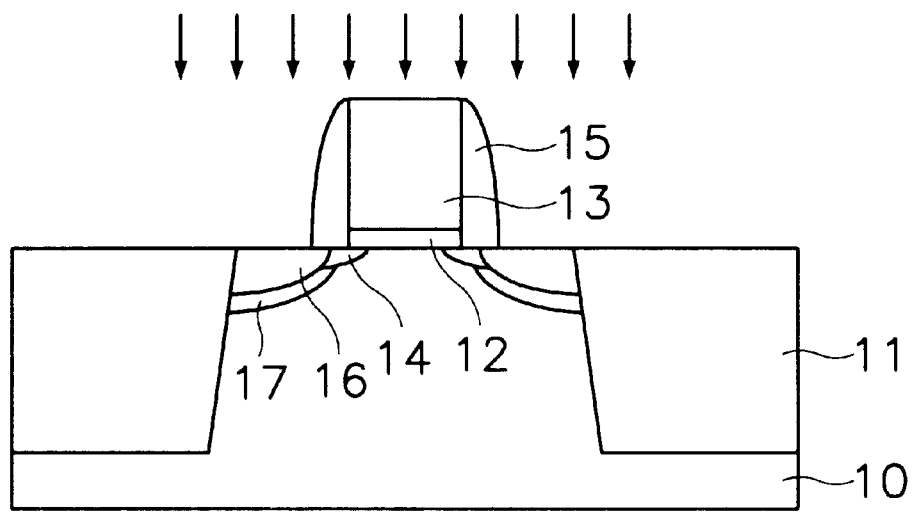
Figure 1C:
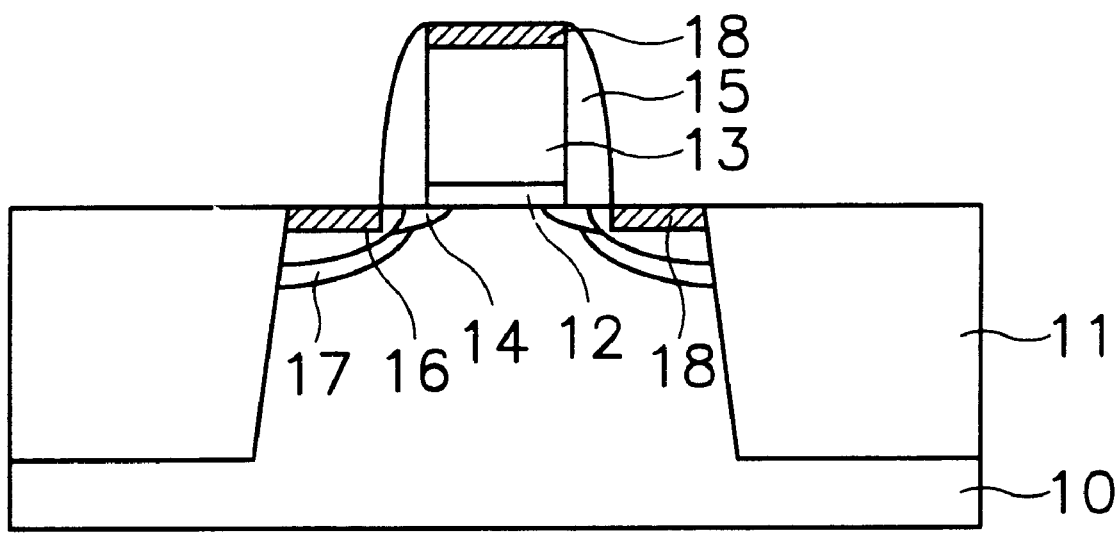
Figure 2A:
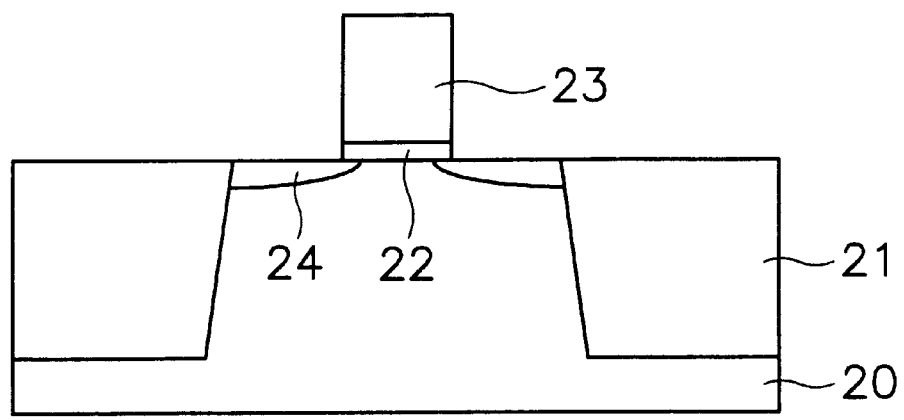
FIGS. 2A through 2D are cross-sectional views illustrating sequential steps of a method for fabricating a semiconductor device in accordance with a first embodiment.

First, referring to FIG. 2A, a field oxide 21 defining an active region is formed on a semiconductor substrate 20. The active region defined by the field oxide can be further characterized as including a central core device region and a peripheral input/output device region. A gate oxide 22 is formed on the active region of the semiconductor substrate 20. A polysilicon layer (not shown) is formed on the gate oxide 22. Here, the gate oxides 22 in the core device region and the input/output device region are formed to be different thickness.

Thereafter, the polysilicon layer is etched using a gate electrode mask as an etching mask, to form a gate electrode 23 on the gate oxide 22 in the core device region and the input/output device region, respectively. A first LDD region 24 is formed by ion-implanting a low concentration impurity ions to the semiconductor substrate 20 at both sides of or around the gate electrode 23 in the core device region. At this time, the ion implant process is performed at a dose ranging from about $1 \times 10^{13}$ to about $2 \times 10^{15}$ ions/cm$^2$ with an ion implant energy ranging from about 10 to about 50 keV.

When the core device region is a PMOS region, the ion implant process is performed using $BF_2$, $B_{11}$ or In as a dopant. In the case that core device region is a NMOS region, the ion implant process is performed using As or P as the dopant.

Figure 2B:
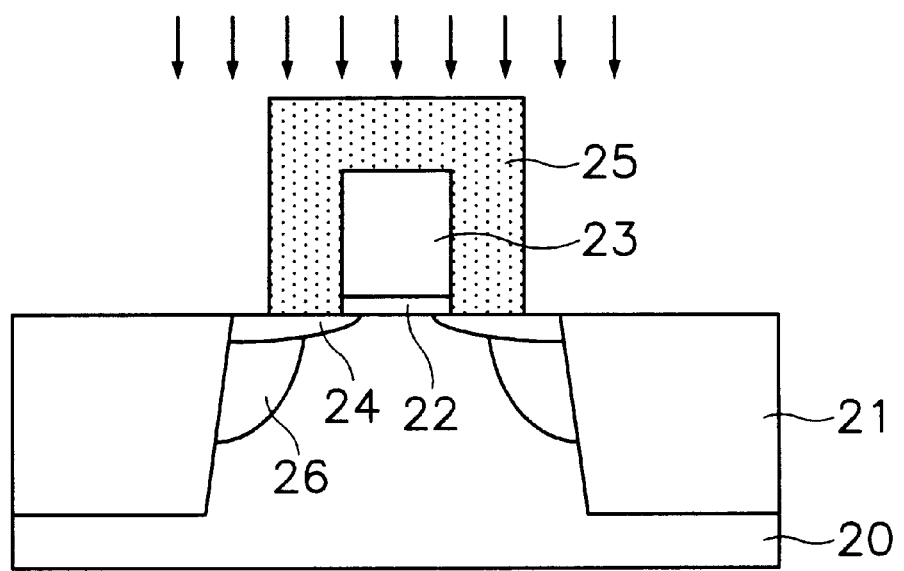

Referring to FIG. 2B, a photoresist film pattern 25 is formed to partially expose the first LDD region 24 at the inner rim of the field oxide 21 in the core device region. The photoresist pattern 25 is used as an LDD ion implant mask in the input/output device region.

Then, an impurity is ion-implanted to the exposed portion of the input/output device region and the first LDD region 24 by using the photoresist film pattern 25 as an ion implant mask, thus forming a second LDD region 26. Here, the ion implant process is performed at a dose ranging from about $1 \times 10^{13}$ to about $2 \times 10^{15}$ ions/cm$^2$ with an ion implant energy ranging from about 10 to about 50 keV. The second LDD region 26 has a deeper profile than the first LDD region 24 (see FIG. 2B).

Figure 2C:
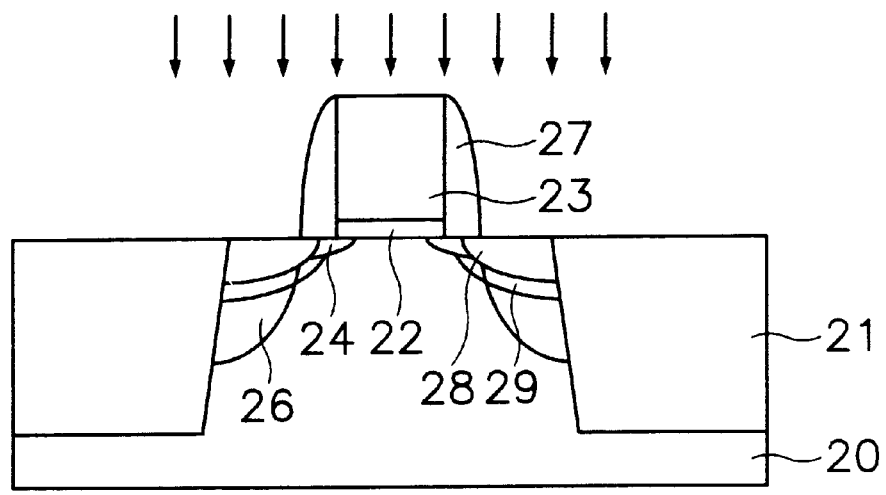

Referring to FIG. 2C, the photoresist film pattern 25 is then removed and an insulating film spacer 27 is formed at sides walls of the gate electrode 23. A first source/drain region 28 is formed by ion-implanting a high concentration impurity to the semiconductor substrate 20 25 at both sides of or around the insulating film spacer 27.

Still referring to FIG. 2C, a second source/drain region 29 is formed by ion-implanting a high concentration impurity to the semiconductor substrate 20 at both sides of or around the insulating film spacer 27. Here, the ion implant processes for forming the first source/drain region 28 and the second source/drain region 29 are performed at a dose ranging from about $1 \times 10^{13}$ to about $1 \times 10^{16}$ ions/cm$^2$ with an ion implant energy ranging from about 5 to about 60 keV. In the case of the PMOS, the ion implant process is carried out by using $BF_2$, $B_{11}$, or In. In the case of the NMOS, the ion implant process is performed by using As or P. In addition, heavy ions are used among the identical conductive type doses when forming a shallow region such as the first source/drain region 28, and light ions are used when forming a deep region such as the second source/drain region 29.

Figure 2D:
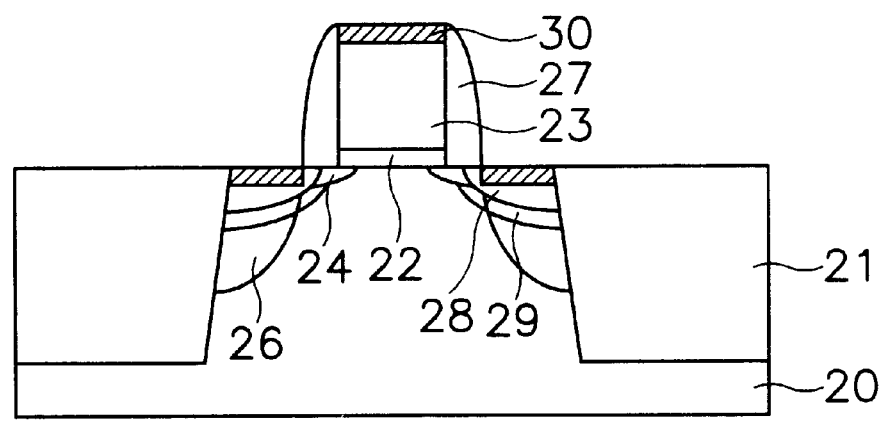

As shown in FIG. 2D, a silicide layer 30 is formed on the gate electrode 23 and the first and second source/drain regions 28, 29.

FIGS. 3A through 3D are cross-sectional diagrams illustrating sequential steps of a method for fabricating a semiconductor device in accordance with a second embodiment. As compared with the first embodiment, the processes of FIGS. 2A and 2B are performed in a different order.

Figure 3A:
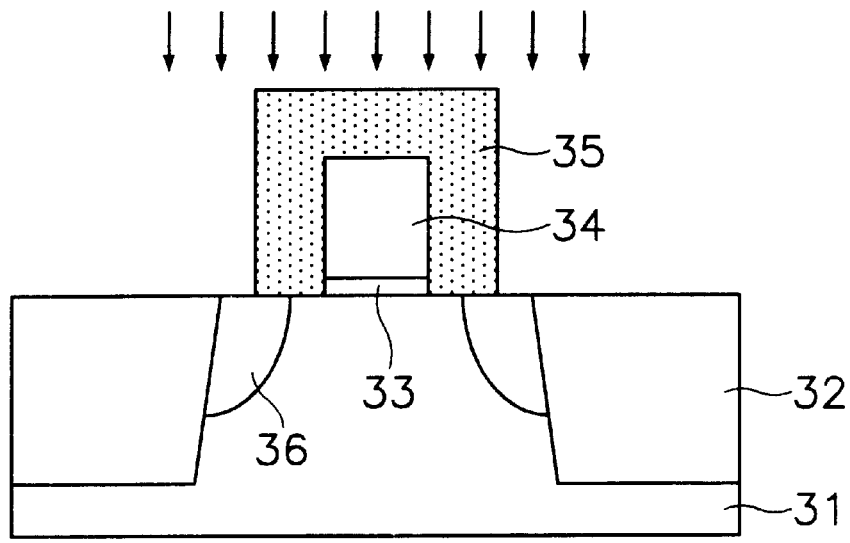
FIGS. 3A through 3D are cross-sectional views illustrating sequential steps of a method for fabricating a semiconductor device in accordance with a second embodiment.

Turning first to FIG. 3A, a substrate 31 is provided with a field oxide 32 that defines an active region that can be characterized as including a central core region and a peripheral input/output device region. A gate oxide 33 and gate electrode 34 are disposed in the active region. A photoresist film pattern 35 is then formed to partially expose the core device region at the inner rim of the field oxide. Then, an impurity is ion-implanted to the exposed portion of the core device region of the substrate 31 using the photoresist film pattern 35 as an ion implant mask, thus forming a first LDD region 36.

Figure 3B:
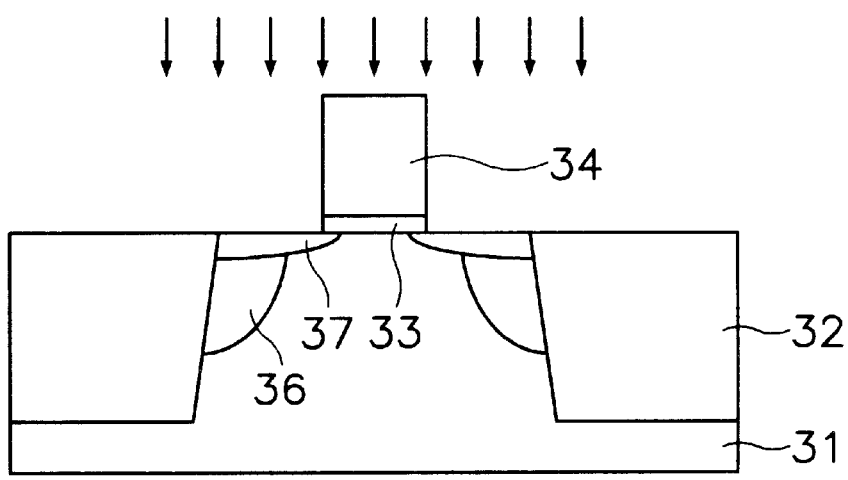

Turning to FIG. 3B, the photoresist film pattern 35 is removed and a second ion implantation step is carried out at a low concentration of impurity ions to form a second LDD region 37.

Figure 3C:
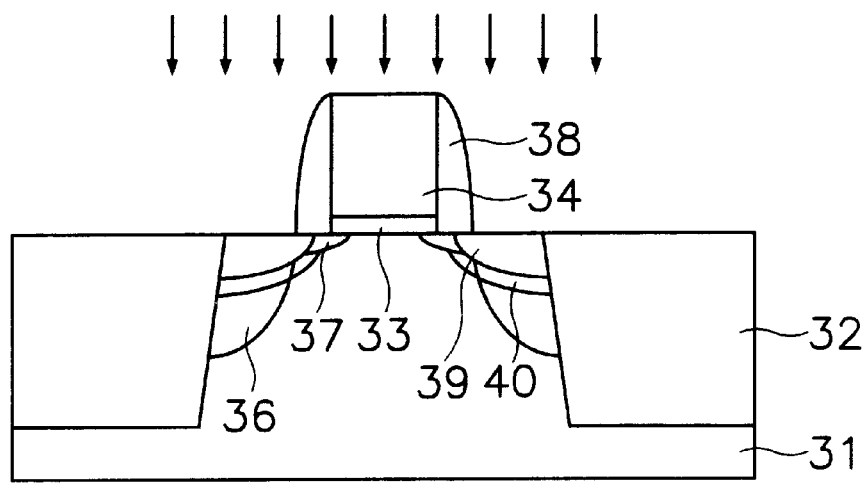
Figure 3D:
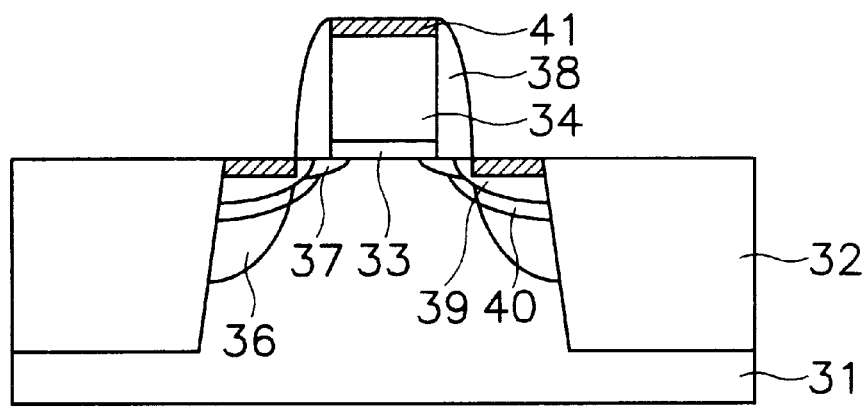

Turning to FIG. 3C, an insulation film spacer 38 is then formed on the sidewall or sidewalls of the gate electrode 34/gate oxide 33 structure. Then, a first source/drain region 39 is formed by ion-implanting a high concentration of impurity ions to the semiconductor substrate 31 around the insulating film spacer 38. Subsequently, a second source/drain region 40 is formed by ion/implanting another high concentration of impurity ions to the semiconductor substrate 31 around the insulating film spacer 27. The first source/drain region 39 is formed using heavy ions while the second source/drain region 40 is formed using lighter ions. Then, as shown in FIG. 3D, a silicide layer 41 is formed on top of the gate electrode 34 and the first and second source/drain regions 39, 40.

As described earlier, in the high speed device structure consisting of a self-aligned salicide, in order to fabricate a device having at least two gate oxide structures in the identical chip, the LDD region of the core device is formed, and the ion implant process for forming the LDD region of the input/output device having a thick gate oxide and the process for forming the source/drain region at the rim of the field oxide of the core device having a thin oxide film are performed at the same time, thereby increasing the depth of the junction region. Thus, a junction leakage current is decreased in the junction region of the peripheral circuit region, and the whole process is simplified without requiring additional processes. As a result, a process yield and reliability of the device are improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed:

1. A method for fabricating a semiconductor device comprising:

forming a field oxide layer defining an active region on a semiconductor substrate, the active region including a core device region and an input/output device region;

forming a thin gate oxide layer on the core device region and a thick gate oxide layer on the input/output device region;

forming gate electrodes on the gate oxide layers;

forming a first LDD region by ion-implanting low concentration impurity ions to the core device and input/output device regions of the active region;

forming a photoresist film pattern which is an LDD ion-implant mask for the input/output region, wherein the photoresist film exposes a portion of the semiconductor substrate at both sides of the gate electrode in the input/output device region and a portion of the semiconductor substrate adjacent to the field oxide layer at the outer rim of the core device region of the active region;

forming a second LDD region deeper than the first LDD region by implanting low concentration impurity ions by using the photoresist film pattern as an ion implant mask;

removing the photoresist film pattern;

forming an insulating film spacer on side walls of the gate electrodes;

forming a deep source/drain region and a shallow source/drain region by implanting high concentration impurity ions to the active region of the semiconductor substrate at least once, by using the insulating film spacer as an ion implant mask; and forming a silicide film on the gate electrodes and the deep and shallow source/drain regions.

2. The method according to claim 1, wherein the low concentration impurity ion is As or P when the input/output device region and the core device region are defined as an NMOS region.

3. The method according to claim 1, wherein the low concentration impurity ion is $BF_2$, $B_{11}$, or In when the input/output device region and the core device region are defined as a PMOS region.

4. The method according to claim 1, wherein the high concentration impurity ion to form a deep source/drain region and a shallow source/drain region is As, P or combinations thereof when the input/output device region and the core device region are formed in an NMOS region.

5. The method according to claim 1, wherein the high concentration impurity ion is $BF_2$, $B_{11}$, In or combinations thereof, to form the deep source/drain region and the shallow source/drain region when the input/output device region and the core device region are defined as a PMOS region.

6. The method according to claim 1, wherein the ion implant process for forming the first LDD region is performed at a dose ranging from about $1\times10^{13}$ to about $2\times10^{15}$ ions/cm$^2$ with an ion implant energy ranging from about 10 to about 50 keV.

7. The method according to claim 1, wherein the ion implant process for forming the second LDD region is performed at a dose ranging from about $1\times10^{13}$ to about $1\times10^{15}$ ions/cm$^2$ with an ion implant energy ranging from about 10 to about 70 keV.

8. The method according to claim 1, wherein the second LDD region of the core device region is formed before the first LDD region is formed.

9. A method for fabricating a semiconductor device comprising:

forming a field oxide on a semiconductor substrate defining an active region, the active region having a core device region and an input/output device region, the input/output device region being disposed between the core device region and an inner rim of the field oxide;

forming a gate oxide layer on the core device region;

forming a gate electrode on the gate oxide layer;

forming a photoresist film pattern over the gate electrode and covering a portion of the input/output device region but leaving a portion of the input/output region exposed that extends from the inner rim of the field oxide to a point of the input/output device region spaced a predetermined distance from the gate electrode;

forming a first LDD region by ion-implanting low concentration impurity ions to the exposed input/output device region using the photoresist film patter as an ion implant mask;

removing the photoresist film pattern;

forming a second LDD region shallower than the first LDD region by implanting low concentration impurity ions and using gate electrode as an ion implant mask;

forming an insulating film spacer on side walls of the gate electrode;

forming a deep source/drain region and a shallow source/drain region by implanting high concentration impurity ions to the input/output device region at least once, using the insulating film spacer as an ion implant mask; and forming a silicide film on the gate electrode and the deep and shallow source/drain regions.

10. The method according to. claim 9, wherein the low concentration impurity ion is As or P when the input/output device region and the core device region are defined as an NMOS region.

11. The method according to claim 9, wherein the low concentration impurity ion is $BF_2$, $B_{11}$, or In when the input/output device region and the core device region are defined as a PMOS region.

12. The method according to claim 9, wherein the high concentration impurity ion to form a deep source/drain region and a shallow source/drain region is As, P or combinations thereof when the input/output device region and the core device region are formed in an NMOS region.

13. The method according to claim 9, wherein the high concentration impurity ion is $BF_2$, $B_{11}$ In or combinations thereof, to form the deep source/drain region and the shallow source/drain region when the input/output device region and the core device region are defined as a PMOS region.

14. The method according to claim 9, wherein the ion implant process for forming the first LDD region is performed at a dose ranging from about $1\times10_{13}$ to about $2\times10^{15}$ ions/cm$^2$ with an ion implant energy ranging from about 10 to about 50 keV.

15. The method according to claim 9, wherein the ion implant process for forming the second LDD region is performed at a dose ranging from about $1\times10^{13}$ to about $1\times10^{15}$ ions/cm$^2$ with an ion implant energy ranging from about 10 to about 70 keV.

* * * * *

UNITED STATES PATENT AND TRADEMARK OFFICE
CERTIFICATE OF CORRECTION

PATENT NO. : 6,586,306 B2  Page 1 of 1
DATED : July 1, 2003
INVENTOR(S) : Hi Deok Lee et al.

It is certified that error appears in the above-identified patent and that said Letters Patent is hereby corrected as shown below:

<u>Column 6,</u>
Line 22, delete "patter" and insert -- pattern --.
Line 38, delete "to." and insert -- to --.
Line 52, delete B11 In" and insert -- B11, In --.
Line 58, delete "1 x $10_{13}$" and insert -- 1 x $10^{13}$ --.

Signed and Sealed this

Eleventh Day of November, 2003

JAMES E. ROGAN
*Director of the United States Patent and Trademark Office*